(12) United States Patent
Kajiwara et al.

(10) Patent No.: US 6,784,554 B2
(45) Date of Patent: Aug. 31, 2004

(54) SEMICONDUCTOR DEVICE AND MANUFACTURING METHOD THEREOF

(75) Inventors: Ryoichi Kajiwara, Hitachi (JP); Masahiro Koizumi, Hitachi (JP); Masayoshi Shinoda, Komoro (JP); Akihiko Narisawa, Kodaira (JP); Asao Nishimura, Koganel (JP); Toshiaki Morita, Hitachi (JP); Kazuya Takahashi, Hitachinaka (JP); Kazutoshi Itou, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/321,567

(22) Filed: Dec. 18, 2002

(65) Prior Publication Data

US 2003/0127747 A1 Jul. 10, 2003

(30) Foreign Application Priority Data

Dec. 26, 2001 (JP) .................................. 2001-393043

(51) Int. Cl.[7] .............................................. H01L 23/48
(52) U.S. Cl. ...................... 257/778; 257/737; 257/741; 257/773; 257/690
(58) Field of Search ................................ 257/778, 737, 257/786, 741, 762, 773, 690

(56) References Cited

U.S. PATENT DOCUMENTS

2003/0001286 A1 * 1/2003 Kajiwara et al. ........... 257/778
2003/0127747 A1 * 7/2003 Kajiwara et al. ........... 257/778

* cited by examiner

Primary Examiner—Mark V. Prenty
(74) Attorney, Agent, or Firm—Dickstein Shapiro Morin & Oshinsky LLP

(57) ABSTRACT

In a semiconductor device in which an LSI chip comprising electrodes with a 100 $\mu$m pitch or less and 50 or more pins is mounted directly on an organic substrate, a mounting structure and a manufacturing method thereof are provided excellent in the solder resistant reflow property, temperature cycle reliability and high temperature/high humidity reliability of the semiconductor device. Electrode Au bumps of the chip and an Au film at the uppermost surface of connection terminals of the substrate are directly flip-chip bonded by Au/Au metal bonding and the elongation of the bonded portion of the Au bump is 2 $\mu$m or more. The method of obtaining the bonded structure involves a process of supersonically bonding both of the bonding surfaces within 10 min after sputter cleaning, under the bonding conditions selected from room temperature on the side of the substrate, room temperature to 150° C. on the side of the chip, a bonding load of ½S×100 MPa to S×180 MPa (S: contact area between bump and chip), a loading mode increasing during bonding, and supersonic application time of 50 to 500 ms.

10 Claims, 10 Drawing Sheets

MODEL CASE 1

Al ELECTRODE ON CHIP SIDE

CONNECTION TERMINAL
SURFACE ON SUBSTRATE

MODEL CASE 2

Al ELECTRODE ON CHIP SIDE

CONNECTION TERMINAL
SURFACE ON SUBSTRATE

MODEL CASE 3

Al ELECTRODE ON CHIP SIDE

CONNECTION TERMINAL
SURFACE ON SUBSTRATE

SEMICONDUCTOR DEVICE AND MANUFACTURING METHOD THEREOF

BACKGROUND OF THE INVENTION

This invention relates to a semiconductor device having an Si chip mounted on a wiring substrate in a face down manner by way of noble metal bumps and a mounting method thereof and, more particularly, it relate to a chip/substrate bonding structure, a metallized constitution of bonding terminals and a metal bonding method capable of reducing chip damages upon mounting and greatly improving the heat resistance, the temperature cycle life, as well as high temperature-high humidity and high temperature maintaining reliability.

Existent flip chip mounting methods for semiconductor chips using Au bumps includes, for example, (1) Au/Au direct bonding,
(2) Au/Au contact connection by chip adhesion with an insulative resin,
(3) Au/Ag grain/Au contact connection by chip adhesion with an anisotropically conductive resin,
(4) Au/Sn melt bonding.

In the contact connection system by resin adhesion (2) and (3), degradation is remarkable in various kinds of reliability tests after exposure to a high humidity circumstance and reliability is poor. In the melt bonding system using the low melting metal (4) and brittle intermetallic compounds are formed on the bonding boundary, tending to cause cracks in the course of cooling after bonding or during a temperature cycle test to lower the strength reliability. At present, a mounting method of most excellent reliability is the Au/Au direct bonding method.

In the existent technique of the Au/Au bonding system, a method of mounting a surface wave device formed with Au bumps in a face down manner on an Au pad of a wiring substrate by metal bonding under application of supersonic waves is disclosed as the prior art in Japanese Patent Laid-open Hei 10-107078 and in the technical report of Electronic Communication Society (July, 1995). In the prior art described above, for reliable metal bonding between an Au bump and an Au pad, the thickness of the Au pad is made 0.5 μm or more and appropriate bonding conditions are adopted as follows: 75 to 300 gf/bump in bonding load; 150 to 250° C. in bonding temperature; and 500 to 800 ms in supersonic wave application time. It is described that 40 to 100 gf/bump can be obtained as the shearing strength for the Au bump bonded portion under the conditions described above. Since the dielectric substrate of the surface wave device is made of a composite oxide system dielectric material, it is described that the device has extremely high strength and suffers from no damage by bonding up to a bonding load of 300 gf/bump. It is described that if the bonding conditions are less than the lower limit values thereof, that is, a bonding load of 75 gf/bump, a bonding temperature of 150° C. and a supersonic wave application time of 300 ms, the bonding strength is lowered and the bonding becomes instable to result in unbonded parts or unbonded bumps thereby lowering the yield or deteriorating the connection reliability, making it difficult to assemble products. Further, only the ceramic substrate is described for the wiring substrate.

On the other hand, a method of mounting a semiconductor chip formed with Au bumps by metal bonding in a face down manner on a wiring substrate containing an organic material is disclosed as the prior art in Japanese Patent Laid-open Hei 10-275826. This prior art describes that a bonded pad portion coated with a hard metal: Ni (3–5 μm)/Au (0.03–0.05 μm) on the wiring substrate is cleaned before bonding by irradiation of ions or atoms in vacuum, and a chip used is stored in a non-oxidative atmosphere just after forming the bumps to keep the cleanness and they are bonded to each other. The wiring substrate and the chip are kept for a predetermined period of time in atmospheric air under heating and pressure and an alloy layer is formed between the hard metal and the Au bump to attain metal bonding. The appropriate bonding conditions are defined as 150 to 300° C. in bonding temperature on the side of the chip and 60 to 120° C. on the side of the substrate, 20 to 30 gf/bump in bonding load and 10 to 150 sec in bonding time. Au remains slightly on the surface of the pad after cleaning by the irradiation of ions or atoms and then bonding is conducted under the conditions described above to form an alloy layer between the hard film Ni and Au bump. It is described that they can be bonded so strongly as causing breakage in a state where a portion of the Ni layer is engraved and deposited to the top end of the bump electrode when the bonded portion is put to a rupture test. While it is described that the bonding temperature can be lowered and the bonding time can be shortened by applying supersonic waves, no details are shown.

Upon development of high speed and high function multi-chip modules mounting newest LSI chips, such as microcomputers, image processing devices and memories, we studied and evaluated the existent Au/Au bonding method. It was necessary for the module substrate to have a minimum wiring pitch of 90 to 40 μm pitch in order to match it with the electrode pitch of the LSI chip. While the usual printed wiring substrate is manufactured by a method of appending a Cu foil and patterning the same by etching, the fine refined pitch is limited to about 100 μm pitch. In the wiring substrate capable of coping with finer pitches, a build-up substrate formed by successive lamination system of forming a thin insulation film on a core substrate and then forming a pattern by a plating method is most promising in view of productivity, reliability and cost. However, the build-up substrate involves problems that the organic insulation layer formed by successive lamination has a relatively low glass transition temperature (100–150° C.) and low modulus of elasticity and the plating processes is restricted to electroless plating making it difficult to form a thick plating layer in view of cost and that flip chip mounting by the existent Au/Au metal bonding is difficult since the rigidity of fine wiring is low due to the restriction in view of shape and size. Examples of our study made concretely are shown below.

A newest LSI chip was flip-chip mounted by Au/Au bonding on the build-up substrate described above by the supersonic bonding technique described above. As a result, under the conditions of 75 gf/bump in bonding load, 150 to 250° C. in bonding temperature and 300 ms in bonding time, micro-cracks were formed on the insulation layer below Al electrodes of the chip formed with Au bumps and it was found that chip damage gives one of major problems in this mounting method. It was also found that fine wiring was deformed greatly when the build-up substrate was heated by the bonding load and the supersonic vibrations exerted on the fine wiring portion and cracks were formed in the Ni layer plated on the surface thereof to cause wiring disconnection. It was found that when the bonding load was lowered in order to avoid such problems, no sufficient bonding could be obtained and the initial conduction failure due to bonding failure could not be eliminated in the LSI chip of 50 pins or more and it is difficult to attain a bonding ratio of 100%. It was also found that an initial positional displacement of about 20 μm at the maximum is caused in a chip of 10 mm square at a bonding temperature of 150° C. due to the difference between a heat expansion coefficient of 17 ppm in the organic substrate and a heat expansion coefficient of 3 ppm in the LSI chip, and the positional displacement is promoted in the deformation process of the Au bumps during supersonic bonding tending to cause short circuit failure with respect to adjacent terminals. Further, when bonding was conducted on a pattern with coarse pitches, it was found that while position displacement or short circuit failure was not caused, large thermal strains were caused between the chip and the substrate in the cooling process after bonding to cause chip damage (cracks in the underlying insulation layer) in an LSI with thin Al thickness and weak underlying structure.

On the other hand, in the existent Au/Au bonding method of cleaning the surface of the substrate and then applying hot press bonding, when a newest LSI chip was flip-chip mounted on the build-up substrate having an Ni (5 μm)/Au (0.05 μm) specification, no sufficient metal bonding was attained by hot press bonding in atmospheric air under the conditions at a chip temperature of 150° C. and a substrate temperature of 60° C., for bonding times of 10 to 150 sec and at a bonding load of 20–30 gf/bump. The bonded state was evaluated by eroding the Al electrode of a bonded sample in an aqueous NaOH solution to remove a chip and checking the transfer rate of the Au bump to the substrate and the presence or absence of metal bonding was judged. As a result of the study on the bonding conditions capable of obtaining 100% Au bump transfer ratio, it was confirmed that a transfer ratio of 100% was obtained under the conditions at a chip temperature of 30° C. and a substrate temperature of 120° C. as the bonding temperature, at a bonding load of 10 to 30 gf/bump and for a bonding time of 150 sec or more. It was however found, since the bonding time is as long as 10 to 150 sec under any of the conditions described above, the temperature of the build-up substrate increased to lower the modulus of elasticity of the insulation layer laminated successively and, due to this phenomenon, a difference was caused to the extent of the deformation between the fine wiring portion of a region with Cu pattern wiring and the fine wiring portion of a region with no such Cu pattern wiring of the core substrate in the underlying portion. Then, it was found the deformation ratio of the Au bumps was scattered to form sufficient metal bonding for Au bumps with large deformation ratio but form no sufficient metal bonding for bumps with small deformation ratio. This is a problem not found in the existent printed wiring board constituted with materials of high glass transition temperature or high modulus of elasticity. While the metal bonding was attained also in the Au bumps with a small deformation ratio when the bonding temperature was increased since the bonding level was increased entirely, it was difficult to mount an LSI with a fine pitch of less than 100 μm for the two reasons that the positional displacement between the bumps and the fine wiring was increased along with thermal expansion of the substrate and the fine wiring portion is deformed greatly to further induce positional displacement. Further, long bonding time results in increased production cost in view of productivity.

Further, a TEG chip simulating an LSI flip-chip mounted by way of an existent Au/Au bonding method to various wiring substrates and mounting samples filled with a resin incorporated with inorganic insulation filler having a heat expansion coefficient of about 30 ppm between the substrate and the chip was manufactured and evaluated by a temperature cycle test at −55/150° C. It was found that, in the sample under the conditions where the transfer ratio of Au bumps to the substrate was 100%, the deformation of the Au bump was large to reduce the gap between the chip and the substrate to cause cracks between the Al electrode of the chip and the Au bumps and cause disconnection at a 1000 cycle level. It was found that, in the sample under the conditions of suppressing the deformation of the Au bumps, the transfer ratio of the Au bump did not reach 100% and, even with those confirmed for conduction at the initial stage, the bonding boundary between the Au bump and the Au connection terminal was opened to reach disconnection in a short period of time by a test for several hundred cycles.

SUMMARY OF THE INVENTION

It is an object of this invention to provide a method of manufacturing a semiconductor device by flip-chip connecting, by Au/Au metal bonding, an LSI chip having electrode pads with a minimum electrode pitch of 100 μm or less and 50 pins or more, even all the pins, to an organic wiring board having a fine wiring layer with a minimum wiring pitch of 100 μm or less and having a surface insulation layer with a low glass transition temperature, without causing positional displacement between the substrate and the chip, and without causing chip damage.

It is another object of this invention to provide a mounting structure as well as a mounting process with high assembling yield and excellent conductivity capable of mounting an LSI chip of multi-pin/fine pitch with high reliability and with low impedance characteristics to an organic wiring substrate having a fine wiring layer.

It is another object of this invention is to provide a semiconductor device in which a multi-pin LSI chip having electrode pads with 50 pins or more is mounted by flip-chip connection on an organic wiring substrate having, on a surface layer, a build-up layer comprising a fine wiring layer and an organic insulation layer with a low glass transition temperature, and in which the flip-chip connection portion is excellent in heat resistance, electrical characteristics, and high temperature/high humidity and temperature cycle reliability.

In this invention, to attain the first object described above, an Au bump is formed on an electrode of an LSI chip, the Au bump having a base of such a size that the diameter or one side of a rectangle thereof is 60 to 100% of an electrode size or 50 to 90% of the minimum electrode pitch with the height of 5 to 40 μm, and a portion thereon of a size 70% or less of the diameter of the base which is further decreased toward the top end and the entire height from the bottom to the top being 30 μm or more. On the other hand, an Au plating film is formed on the outermost surface of connection terminals of Cu wiring on the side of an organic wiring substrate having a fine wiring layer. Before flip-chip bonding them, the surface of the Au bump is physically etched by 5 nm or more by Ar ion sputtering under an atmospheric pressure or a reduced pressure of 0.1 to several Pa of Ar, while the Au plating surface on the side of the connection terminals is physically etched by 5 nm or more or by about 1/10 to about 1/2 of the Au film thickness by Ar ion sputtering. In a case of physically etching both of them under the reduced pressure, the pressure is increased by a nitrogen gas or dry air removed with water content and they are taken out respectively into atmospheric air. An organic wiring substrate is mounted on a stage of a bonding apparatus, the LSI chip is upturned and adsorbed to a bonding tool surface of a supersonic bonding head, and both of them are positionally aligned and stacked to each other by lowering the bonding head. In this step, the stage or the bonding tool is kept at a predetermined temperature and the temperatures of the organic wiring substrate and the LSI chip are kept at a predetermined temperature in the positioning step. After stacking, pressure and supersonic vibrations are applied to the back of the chip to conduct metal bonding between the Au bump and the Au plating film. For the bonding conditions, the load P applied per 1 bump is selected from the range:

$$\tfrac{1}{2} S_1(m^2) \times 120(MPa) \leq P(N) \leq S_1(m^2) \times 180(MPa) \quad (1)$$

(where $S_1$: Au bump/electrode contact area). That is under the load higher than the condition described above, chip damage caused by the deformation by the Au bump occurs at the contact portion between the Au bump and the chip electrode. On the other hand, under the lower load, the bonding area is remarkably decreased compared with the bump size and, when distortion occurs between the chip and the substrate, the bump main body is not deformed but strains are concentrated to the bonded boundary to increase the probability of wire disconnection.

Other bonding conditions are set to a humidity in the bonding atmosphere of 60% or less, a bonding temperature within a range from room temperature to 60° C. on the side of the stage mounting the substrate and from room temperature to 150° C. on the side of the bonding head, a bonding time within a range of 50 to 500 nm and a vibration amplitude in a case of 50 kHz within a range from 0.3 to 2.0 μm for the amplitude of the chip. Accordingly, from 0.6 to 4.0 μm in a case of the tool amplitude at the vibration transmission efficiency between the bonding tool and the chip of ½, from which appropriate conditions are selected in accordance with a work. Further, the load is applied by a method of increasing from a low load to a high load during application of supersonic waves and the exposure time of the bonded work to atmospheric air from the surface cleaning to the bonding is 10 min or less. Under the range of the bonding conditions described above, it was confirmed that Au/Au metal bonding can be attained for all pins while retaining the deformation of the Au bumps only near the top end, with no positional displacement between the substrate and the chip and without causing damage to the chip. Examples for the result of the study are shown in FIGS. 12 and 13. FIG. 12 shows scanning electron microscopic images of the cross section and the tensile fracture surface of the bonded portions in a case of Ar-sputter cleaning for both surfaces of the organic substrate and the chip to about 20 nm in Au thickness and conducting supersonic bonding with a tool amplitude of 3 μm. Even when the bonding area on the side of the substrate is decreased to about ⅕ compared with the bonding area on the side of the chip by decreasing the bonding load, it was confirmed that a portion of the bump is deposited on the side of the substrate in the tensile-fracture surface to provide metal bonding. The metal bonding defined herein means that bonding showing ductility rupture along with local elongation is attained in the Au/Au bonded portion in a case where it is fractured at the bonding boundary by tensile force. In addition, this can be confirmed by the observation of Au protrusions at the fractured surface observed on the side of the bump and on the side of the plating film along the broken cross section. FIG. 13 shows a cross sectional photograph in which chips with a bump size of 50 μmφ and the electrode pitch of 80 μm are bonded to a build-up substrate. Since the bonding temperature on the side of the substrate is at room temperature, there is no thermal deformation and it can be seen that the Au bump is bonded accurately about at the center of the connection terminal in view of the cross sectional images with a low magnification ratio. Furthermore, the state where the tissue of the Au bump is crushed flat only on the side of the substrate to provide metallic bonding can be seen from photographic images with a medium to high optical magnification ratio. When chip damage was checked for the bonded samples under the conditions described above, occurrence of damages was not observed. Based on the results of the study, it was confirmed that a method of manufacturing a semiconductor capable of reliably flip-chip bonding even an LSI chip having electrode pads with a minimum electrode pitch of 100 μm or less and having 50 or more pins, and even all the pins, by Au/Au metal bonding without causing positional displacement between the substrate and the chip and without chip damage.

Then, to attain the second object, the Au bumps described above are formed to the LSI chip and the Au plating film is formed on the side of the substrate. The method of surface cleaning by sputtering before bonding adopts a step of simultaneously conducting an evacuation step and an Ar gas introduction step partially in which a step of mounting a plurality of LSI chips on a tray and conducting collective sputtering and a step of collectively sputtering a plurality of substrates are conducted successively in accordance with a required number of works. Further, a method of bonding by applying supersonic waves and a load while setting the bonding temperature to room temperature on the side of the stage for mounting the substrate and elevating the temperature only on the side of the bonding head for adsorption of the chip is adopted. At first, since the evacuation and Ar gas introduction are partially overlapped in view of the time in the sputter cleaning step, the time for controlling the Ar gas pressure to a predetermined pressure can be shortened to enable early starting for electric discharge. Since chips are handled in the tray, a plurality of chips can be transported and cleaned simultaneously. In addition, since the substrates and the chips are separately cleaned, the cleaning conditions for each of them can be optimized and required number of them can be cleaned respectively at good timing, so that time required for cleaning the work can be shortened greatly. Further, by the supersonic bonding combined with the step of cleaning the bonded surfaces of both of the substrate and the chip, Au/Au bondability can be improved greatly and bonding under low load, at low temperature and in short time is possible and the positioning step can be shortened since the temperature elevation time is shortened and the thermal fluctuation is not present, thereby greatly shortening the flip-chip bonding step to improve the productivity. Further, by the improvement of the bondability, bonding failure can be decreased drastically and the yield of the conductivity can be improved.

Then, to attain the third object, this invention adopts a structure in which a fine Cu wiring pattern on an organic insulation layer formed on a wiring substrate is formed in a shape protruding above the insulation layer, an Au film is formed on the outermost surface of the Cu wiring, metal bonding is conducted at such a bonding level that the Au bump bonded portion is elongated by 2 μm or more relative to the tensile force for the Au bump on the LSI chip electrode and the Au plating layer, and a resin containing a fine inorganic filler with a low heat expansion coefficient is filled and cured in a gap between the chip and the substrate. Definition of the condition where Au is elongated by 2 μm or more is shown together with fractured examples in FIGS. 9 to 11. Depending on the bonding level, the fractured position is classified into that near the bonding boundary of the bump/Au film, in the bump and near the bonding boundary of the bump/Al electrode. In each of the cases, Hb–H0 is defined as Au elongation. At first, since the structure connected by Au/Au metal bonding is adopted, the heat resistance and electrical characteristics of the connection portion can be improved greatly. Then, since the Au/Au bonding level has a performance capable of absorbing strains of 2 μm or more in the bonding boundary, since the inorganic filler-incorporated resin is filled between the chip and the substrate, and cured so as not to exert large distortion on the bonded portion, and since the height of the wiring layer of the substrate is increased compared with the substrate surface to increase the substantial chip/substrate gap, thereby decreasing the thermal strain exerted on the bonded portion, the temperature cycle reliability can be improved remarkably and, since the extension of the chip/substrate gap by moisture absorption or the like can be absorbed by the ductile Au bonded portion, the high temperature/high humidity reliability can also be improved remarkably.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

Figure 1:
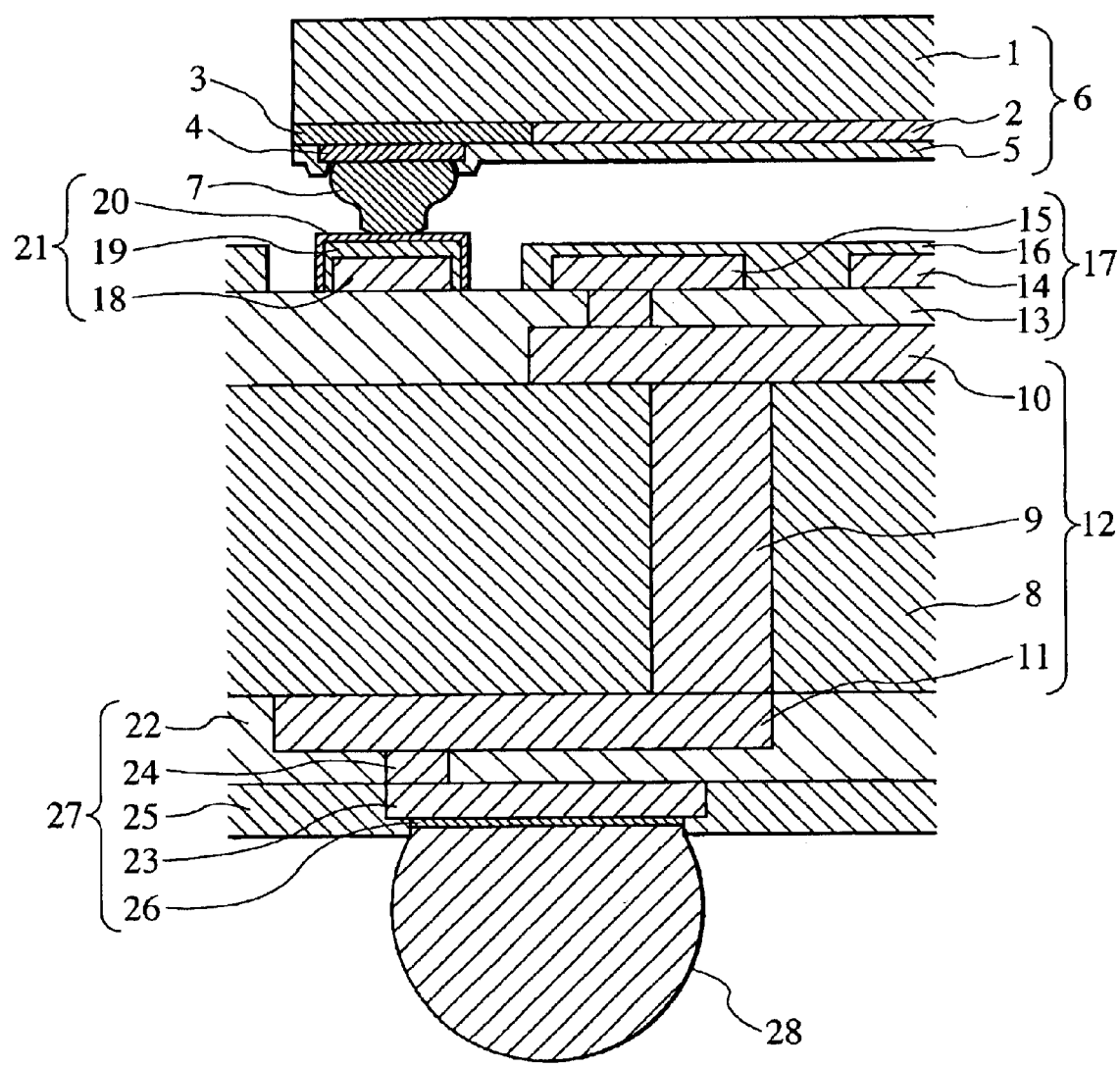
FIG. 1 shows a cross sectional structure of a semiconductor device according to one embodiment of this invention.

FIG. 1 shows a cross sectional structure of a semiconductor device according to one embodiment of this invention. In the figure, a wiring substrate comprises a core substrate 12, build-up layers 17, 27 formed on both sides thereof, and a chip connection terminal 21. The core substrate 12 comprises a coarse wiring layers 10, 11 formed by patterning a Cu foil bonded with a glass epoxy insulation plate 8 by etching and a through hole 9 for connecting the wiring on the surface and the rear face. In addition, the build-up layer 17 comprises a thin insulation layer 13 formed by coating, a fine wiring layer 14 formed thereon by a plating method and a via hole 15 for connecting the coarse wiring layer and the fine wiring layer. The thin insulation layer in the build-up layer is formed by bake-curing a liquid resin at a temperature of 150 to 180° C., and the thin insulating layer has a Tg temperature of 150° C. or less and modulus elasticity of a lower value. The chip connection terminal 21 comprises a fine wiring 18 formed by Cu plating, an Ni plating layer 19 thereon and an Au plating layer 20 further thereon. Ni plating is formed by P-incorporated electroless plating having a film thickness of 5 to 10 μm, while the Au plating is formed by a substitution type electroless plating having a film thickness of 0.03 to 0.06 μm. A semiconductor chip 6 has a region for a circuit forming area 2 formed at the center and a region for a laminated insulation film 3 formed on the periphery of the semiconductor substrate 1, and has an Al electrode pad 4 for external connection and a protective film 5 covering other regions than described above. An Au bump 7 is formed on the Al electrode pad of the semiconductor chip by a ball bonding method using supersonic hot press bonding. The chip has electrode pads by the number of 256 pins, the pad pitch is 80 μm, the pad size is 65 μm in square, the pad material is Al—Cu or Al—Cu—Si and the Al film thickness is 400 to 1000 nm. The size of the Au bump is such that the bump diameter after press bonding is 50 μmφ, the height of the base is 10 to 25 μm, the diameter of the neck is 30 to 40 μmφ with the height thereof of 35 to 50 μm and the overall height also including the protrusion of the wire is 50 to 70 μm. Then, for the surface cleaning treatment in the flip-chip bonding step, the Au bump surface on the side of the chip is sputter etched by an Ar gas in an amount corresponding to 10 to 20 nm in the Au film thickness and the Au pad surface on the side of the substrate is sputter etched in an amount corresponding to 5 to 10 nm in the Au film thickness.

Figure 13:
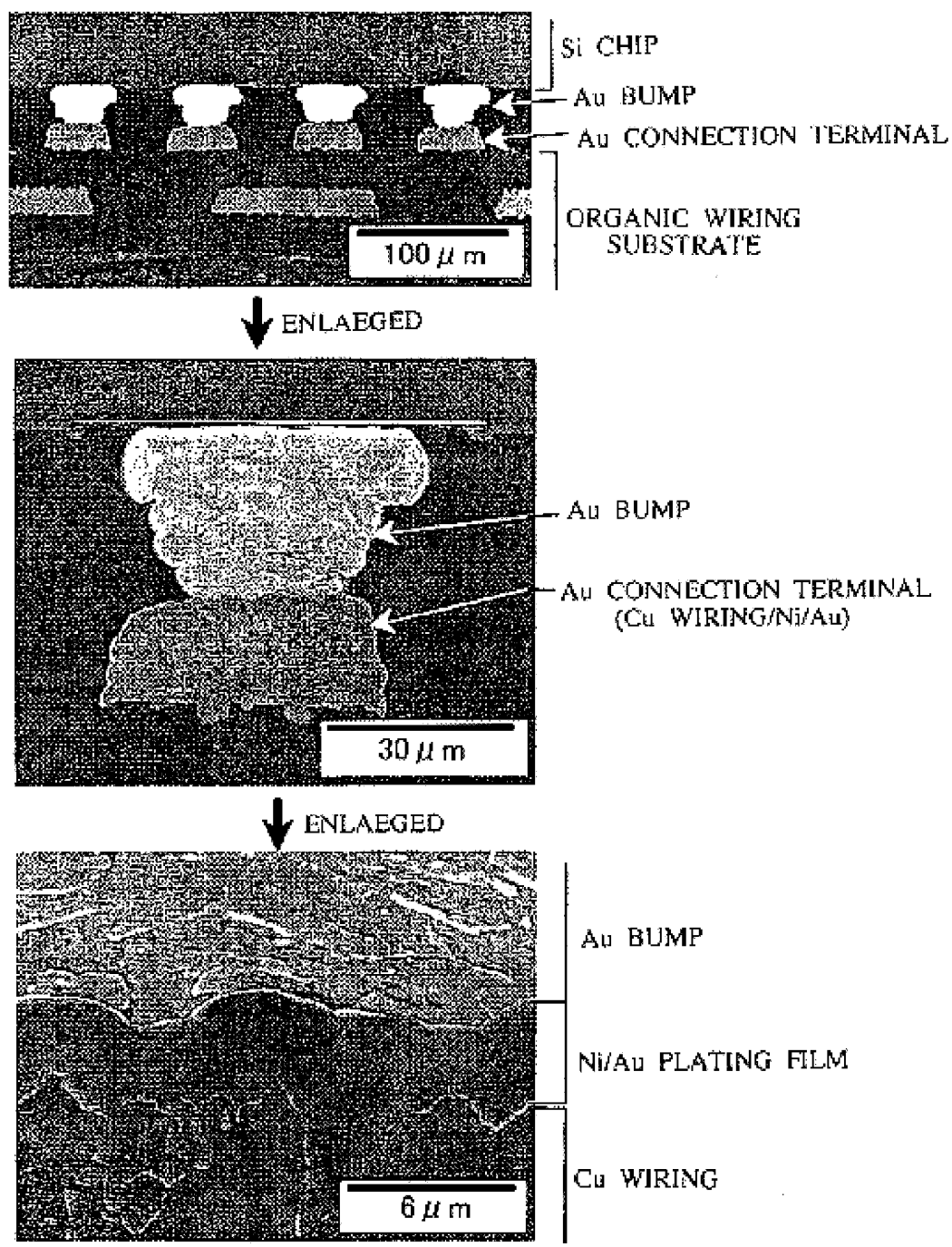
FIG. 13 is an example of a bonded cross section of 80 μm pitch LSI chip and build-up substrate.

Bonding is conducted in an atmosphere at relative humidity of 60% or less within 10 min of time from taking out into the atmospheric air till bonding after the surface cleaning treatment. For the bonding conditions, the load changing system of increasing the load during application of supersonic waves is adopted as the bonding load mode under the conditions within the ranges of an initial load of 1 to 5 g/bump, and a final load of 10 to 30 g/bump. Vibration amplitude of a tool top urged to the chip is within a range from 1 to 40 μm. A supersonic wave application time is within a range of 100 to 500 ms. Optimum conditions are selected from the above conditions. Specifically, bonding is conducted at the initial load of 5 g/bump (1.28 kg), at the final load of 20 g/bump (5.12 kg), within the vibration amplitude of 3 μm and for a supersonic wave application time of 300 ms. For the bonding temperature, the tool heating temperature on the side of the chip is 150° C. and the temperature of the stage for mounting the substrate is at room temperature of 20° C. The cross section of the actual bonded portion is as shown in FIG. 13. Although the Au film thickness of the build-up substrate is extremely thin, defects is scarcely observed for the Au/Au bonded boundary and metal bonding is attained. A lead free solder bump 28 was formed by way of an Ni plating film to the external connection terminal 23 of the organic substrate. The Au film at the initial stage was dissolved into the solder and did not remain on the boundary.

According to this embodiment, the LSI chip formed with the fine Au stud bump can be flip-chip connected for the overall 256 pins by Au/Au metal bonding onto the organic wiring substrate having the surface insulation layer with low grass transition temperature formed at a wiring pitch of 80 μm, without causing positional displacement of connection portion and without causing chip damage, that is, without causing cracks in the multi-layered insulation film below the Al electrode. Therefore, a highly reliable multi-chip module in which a newest super high-speed LSI chip is mounted on the organic substrate can be provided. In this case, since no special fabrication is necessary for the LSI chip, the cost of the module products can be lowered. Since the module can be made up of the organic substrate that can be manufactured in a short period of time (about two months), this can provide an effect capable of developing a module incorporated in a system suited for the customer's specification in a short term. Further, it has also an advantageous effect capable of mounting the chip to the substrate with the chip approaching the substrate by about 0.1 mm thereby attaining high density mounting and reducing the size of the module. On the other hand, since the ductile Au/Au metal bonding is adopted for the structure of the bonded portion, which has a bonded shape in which it is larger on the side of the chip and smaller on the side of the substrate, even when strains should occur between the chip and the substrate, the strains are absorbed by plastic deformation near the Au bump portion on the side of the substrate or near the bonded boundary before large stresses are induced to the chip, assembling failure such as damages to the chip or disconnection in the bonded portion does not occur in the module assembling step to provide an effect capable of assembling the module at high yield and reducing the product cost.

Further, since flip-chip mounting can be conduced to an extremely thin connection terminal with an Au film thickness of 0.03 to 0.06 μm, this can also provide an effect capable of reducing also the Au film thickness on the side of the external connection terminal of the substrate, not forming an AuSn inter-metal compound layer even when the solder bump is formed with a solder containing a great amount of Sn, and increasing the strength of the solder connection portion to improve the connection reliability with a mother board.

Figure 2:
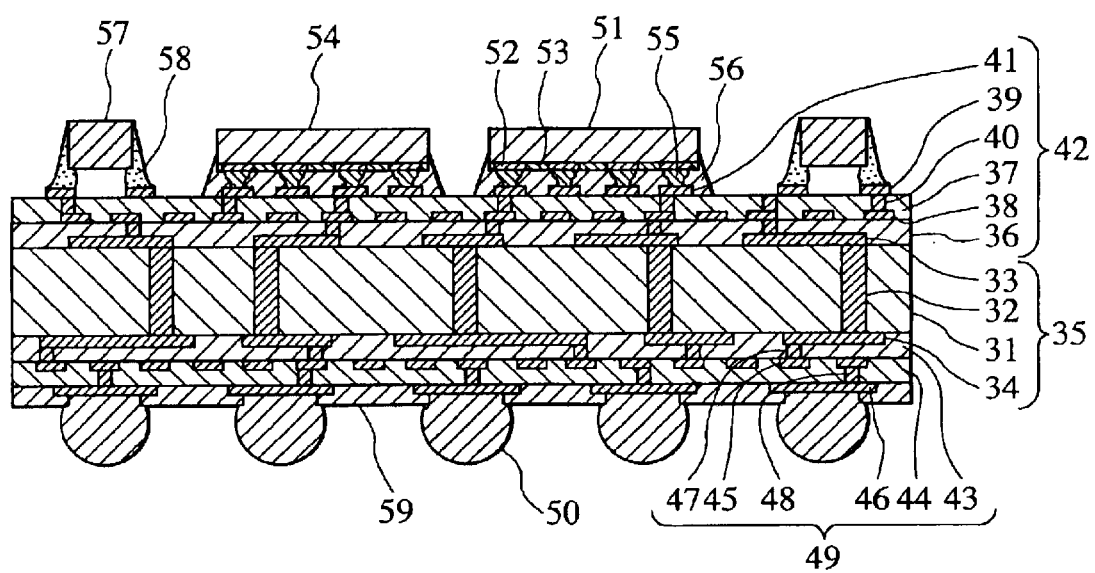
FIG. 2 shows a cross sectional structure of a semiconductor device according to another embodiment of this invention.
Figure 3:
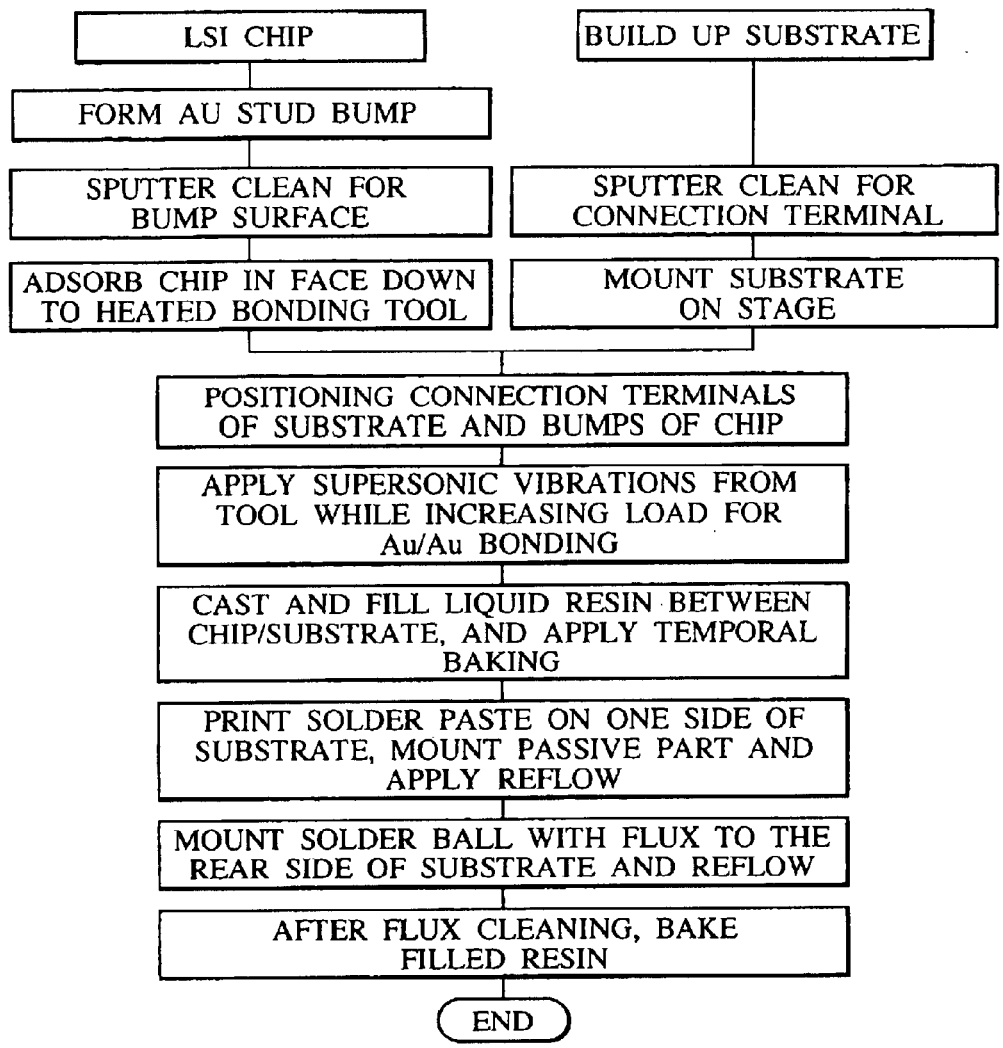
FIG. 3 shows a cross sectional structure of a semiconductor device according to another embodiment of this invention.

FIG. 2 shows a structure of a semiconductor device according to another embodiment of this invention. In the figure, the build-up substrate has a structure in which build-up layers 42, 49 are formed on both sides of a core substrate 35 having through hole wiring 32 and both face wiring 33, 34. The build-up layer 42 comprises insulation layers 36, 37 formed by coating, fine wiring 38 formed by plating, via hole wiring 40 and connection terminal 39, 41 formed by plating of an Au film of 0.005 μm in thickness at the uppermost surface. The build-up layer 49 comprises insulation layers 43, 44 formed by coating, fine wiring 45 formed by plating, via hole wiring 47, 48 and connection terminal 46 formed by plating of an Au film of 0.005 μm in thickness at the uppermost surface. On one side of the build-up substrate, are connected and mounted a plurality of LSI chips 51 by Au—Au metal bonding to the connection terminal 41 of the substrate by way of an Au bumps 55 formed by the ball bonding method on Al electrodes 52. They are assembled at a bump height of 30 μm and at a wiring height of 20 μm. An under fill resin 56 incorporated with an organic filler having good bondability with a passivation film 53 on the side of the chip and an insulation layer 37 of the substrate is filled between the LSI chip and the substrate. Further, passivation parts 57 are connected and mounted by lead free solder 58 to the connection terminals 39. On the other hand, a resist film 59 is formed on the opposite side of the build-up substrate so as to cover a portion of the connection terminal 46 and a lead free solder bump is formed on the connection terminal. FIG. 3 shows an embodiment of a flow for assembling the semiconductor device of FIG. 2.

After forming the Au stud bump on LSI chip and sputter cleaning them and providing a sputter cleaned build-up substrate, a predetermined number of LSI chips are successively flip-chip bonded by supersonic waves onto the substrate. The sputtering thickness of the Au bump is 10 nm or more and the sputtering thickness of the substrate is 1/10 or more of the Au film thickness or 10 nm or more. The bonding temperature is from room temperature to 150° C. on the side of the chip and from room temperature to 60° C. on the side of the substrate. After bonding the LSI chip, the under fill resin is cast between the chip and the substrate and provisionally baked at 120° C. or lower. Then, solder paste is printed to passive part connection terminals on the chip mounting side of the substrate, and the passive parts are supplied and reflow is conducted. Then, solder balls partially coated with flux are supplied to the connection terminal and caused to reflow. Finally, after cleaning the flux, the under fill resin below the LSI chip is completely cured by baking at 150° C. to complete assembling.

According to this embodiment, since the LSI chip and the build-up substrate are assembled with a gap between them as large as 50 μm and the resin is filled to the gap and cured by heat baking, compressive force is always applied to the bonded portion by the curing shrinkage of the resin and cooling form the bake temperature at 150° C. and no large force is induced in the peeling direction to the bonded portion during temperature cycle test or a high temperature high humidity test, and large stresses are not induced on the periphery of the bonded portion because minute strains in the shearing direction can be absorbed by the plastic deformation of soft Au bumps. Thus, a semiconductor device with extremely high connection reliability for the LSI chip can be provided. Further, since the Au film for the connection terminal of the substrate is formed with a film as thin as 0.05 μm, it has also an effect capable of improving the reliability of the solder connection portion. Further, since the minute connection portion of the LSI chip is connected metallurgically to the substrate with Au of low electric resistance, at a shortest distance, the connection portion is excellent in electric characteristics having extremely low electric resistance and inductance components, which can also provide an effect of decreasing a signal transmission delay and not lowering the performance of high speed system. Further, since the heat resistance of the Au/Au flip-chip bonded portion is high, subsequent solder mounting of the passive parts or LSI parts can easily be conducted and hybridization of the newest LSI chip and the solder bonded parts is possible to provide an effect of extending the range for selecting the system constitution and facilitating the design.

Figure 4:
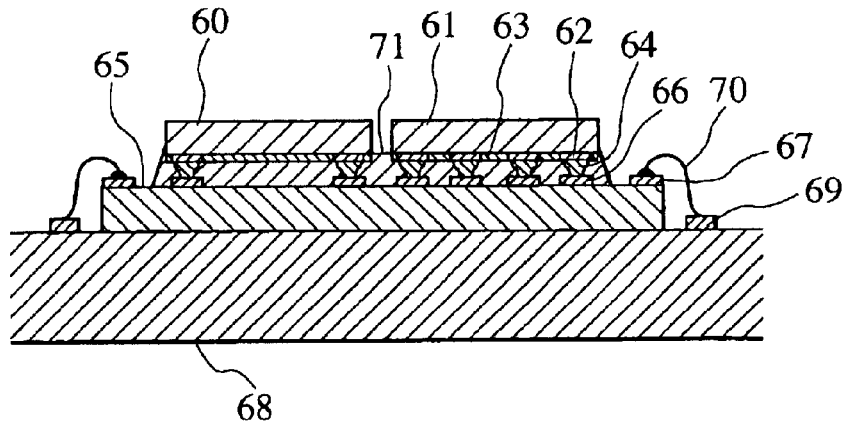
FIG. 4 shows a cross sectional structure of a semiconductor device according to another embodiment of this invention.

FIG. 4 shows a cross sectional structure of a semiconductor device according to another embodiment of this invention. Ni/Au plating is applied to the Cu pattern of fine connection terminals 66 of a fine one-side wiring substrate 65. Au stud bumps are formed on the Al electrode of LSI chips 60, 61 and connected with connection terminals of the substrate 65 by Au/Au metal bonding. A low heat expansion resin incorporated with an inorganic filler is filled between the substrate and the LSI chip and cured by heating. The substrate 65 is bonded and secured to a motherboard 68 and, the substrate and the motherboard are connected to each other by wire bonding of Au wire 70.

According to this example, since the module is composed of the one-side wiring substrate having no through holes, this can be produced by an etching process for a substrate appended with a thin Cu foil and provides an effect capable of lowering the module cost by decreasing the substrate cost. Further, since the solder bonded portion is not present including mounting of the substrate on the motherboard, it also provides an effect of facilitating the assembling with no restriction on the solder-mounting of parts to be attached subsequently and improving the temperature cycle reliability and high temperature/high humidity reliability.

Figure 5:
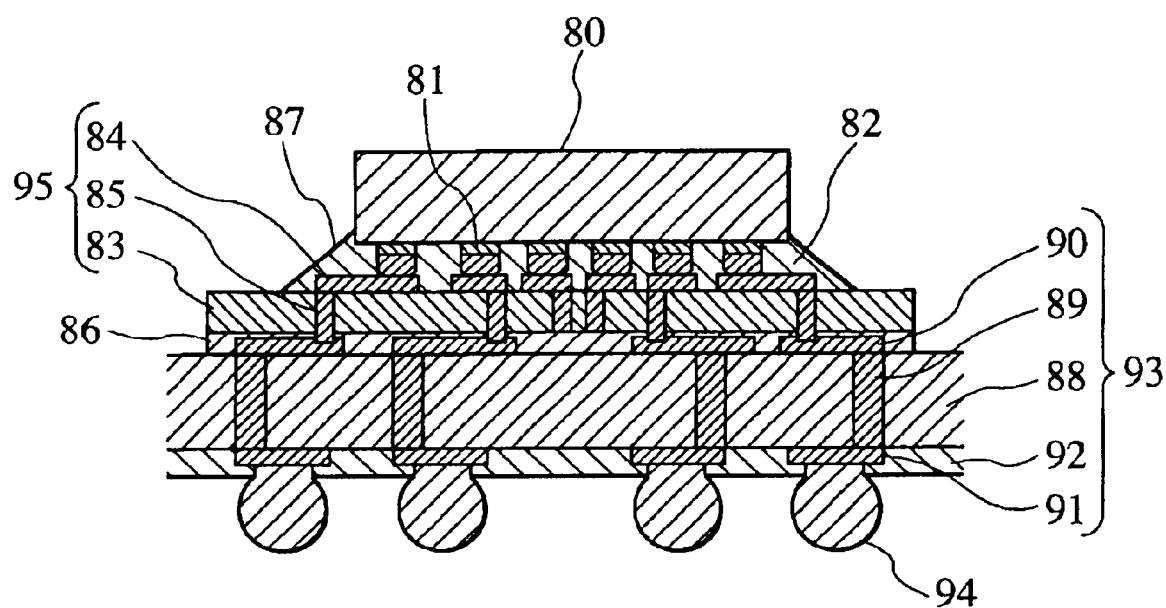
FIG. 5 shows a cross sectional structure of a semiconductor device according to another embodiment of this invention.

FIG. 5 shows a cross sectional structure of a semiconductor device according to another embodiment of this invention. In the figure, a one side tape substrate 95 having through holes 85 is appended with an adhesive 86 to a portion on one surface of a two layered wiring printed substrate 93 and through hole electrodes 85 of the tape substrate and connection terminals 90 of the printed substrate are bonded to each other by Au/Au hot press bonding under a high load condition. The wiring connection terminals 84 of the tape substrate are Au/Au bonded to Au plated bumps 82 formed on Al electrodes 51 of an LSI chip 80 by supersonic hot press bonding. A resin 87 is filled and cured between the chip and the tape substrate. Solder bumps are formed at external connection terminals 91 on the back of the printed substrate.

This embodiment adopts a structure in which a fine wiring area is formed only in an LSI chip mounting portion. Since a module substrate can be manufactured by a method of press bonding the fine wiring tape substrate prepared by a separate step, the throughput of the substrate production can be enhanced and the cost can be reduced. Further, when the specification of the LSI chip is changed for the reason of chip shrink, for example, the substrate can be manufactured again with a minimum change only for the tape substrate to provide an effect also capable of shortening the developing term for the change of the specification.

Figure 6:
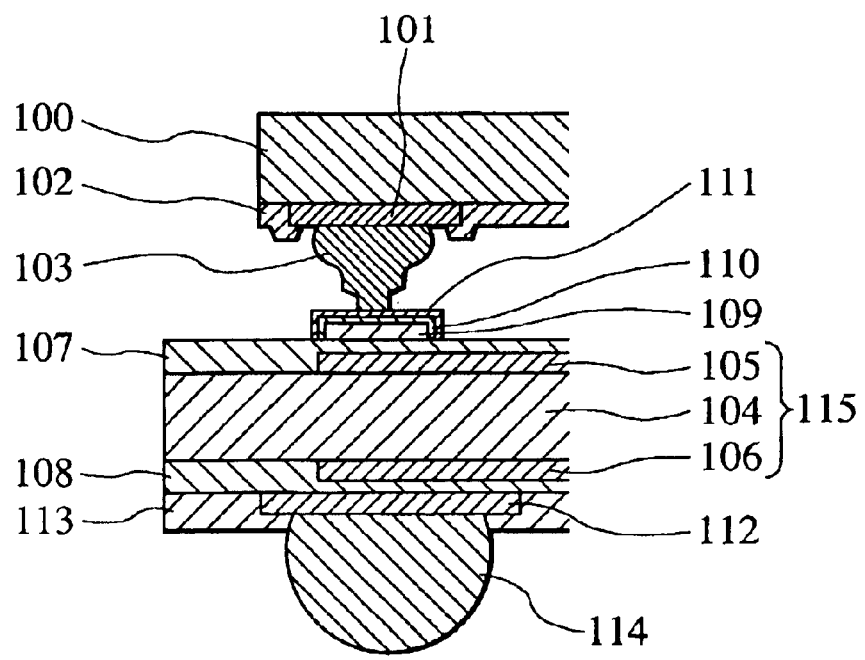
FIG. 6 shows a bonded structure between an LSI chip and an organic wiring substrate according to an embodiment of this invention.

FIG. 6 shows a bonding structure between an LSI chip and an organic wiring substrate according to another embodiment of this invention. In the figure, an Au stud bump 103 is formed by a ball bonding method on an Al electrode 101 of an LSI chip 100. The stud bump comprises a base portion of 20 $\mu$m in thickness formed by crushing an Au ball by the top end surface of a capillary tool, a body portion formed by pressing it into a capillary hole and a spire-like tapered top end formed by tensile fracture of an Au wire, in which only the top end is crushed and Au/Au bonded to the connection terminal of the substrate. The diameter of the bonded portion is 45 $\mu$m on the side of the chip and the diameter of the bonded portion on the side of the substrate is 30 $\mu$m. The organic wiring substrate has a structure in which thin insulation layers 107, 108 are formed on both surfaces of a core substrate 115 and then a fine wiring layer is formed thereon. The chip connection terminal has a structure of applying Ni/Au or Ni/Pd/Au plating on a Cu pattern and the thickness of Au or thickness of Pd and Au is from 0.05 to 0.1 $\mu$m.

According to this embodiment, since the bonding area on the side of the substrate is as small as ½ or less compared with the bonding area on the side of the chip, and the height of the bump is large while maintaining the height of the body portion of the stud bump at the initial stage, even when the warp of the substrate should return upon release of the load after bonding, a force ½ or more of the Au yield strength is not applied to the periphery of the Al electrode of the chip, so that the multi-layered insulation film below the Al electrode is not broken in view of the stress. Accordingly, this can provide an effect of improving the assembling yield even when the accuracy of the planarity of the substrate is poor. The problem of stress can be avoided in the same manner also during bonding and the embodiment also provides an effect capable of reducing the chip damage upon bonding, by controlling the shape to that of the bump of this embodiment.

Figure 7:
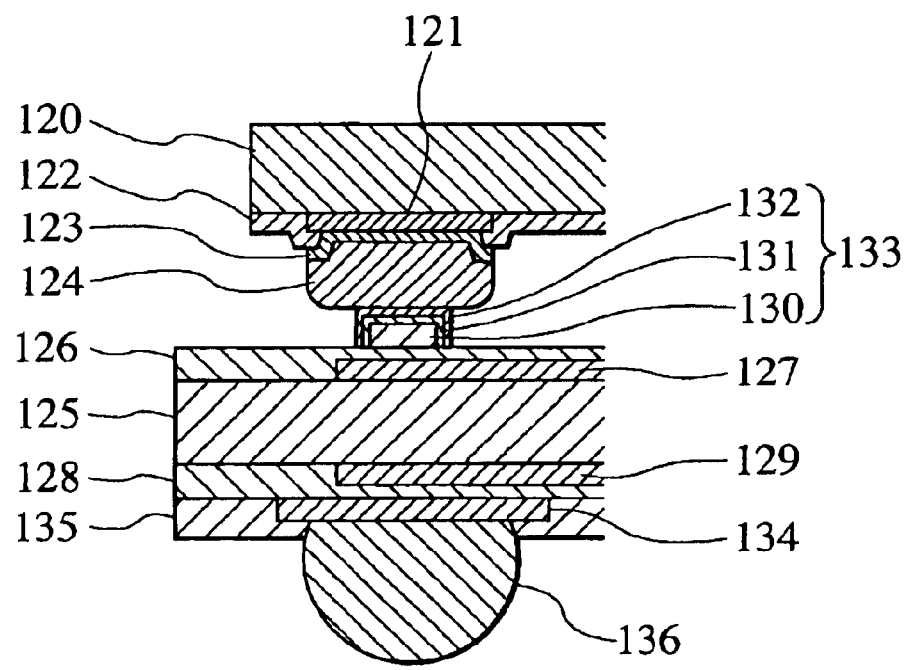
FIG. 7 shows a bonded structure between an LSI chip and an organic wiring substrate according to another embodiment of this invention.

FIG. 7 shows a bonding structure between an LSI chip and an organic wiring substrate according to another embodiment of this invention. In the figure, a metallized film 123 is formed so as to partially extend over a passivation film 122 on an Al electrode 121 of an LSI chip 120, on which an Au bump is formed by a plating method. The Au bump is applied with a heat treatment after the plating step and applied with a softening treatment such that the Vicker's hardness Hv is 80 or less. A chip connection terminal 137 of the organic wiring substrate is designed such that the size at the top end of the connection terminal is smaller than the size of the bottom of the bump, and the bonding area on the side of the terminal after bonding is ½ or less relative to the area of a bottom of the bump. Specifically, the bump has 40 $\mu$m in square×15 $\mu$m in height, and the connection terminal has 30 $\mu$m in width at the base and has 20 $\mu$m in width and 20 $\mu$m in height at the top end. The connection terminal has a structure in which Ni—P/Au or Ni—P/Pd/Au plating is applied on a Cu pattern and a thickness of Au or a thickness of Pd+Au is 0.05 to 0.1 $\mu$m.

Since this embodiment has a structure in which the LSI chip formed with the Au plated bump is mounted to the organic wiring substrate by Au/Au metal bonding, an Al electrode is not exposed to the outside and free from the effect even when exposed to a corrosive circumstance of high temperature and high humidity atmosphere, so that a semiconductor device with high reliability can be provided. Further, since the bottom of the bump is so large as to extend over the passivation film, and the connection terminal is disposed at a position corresponding to the center of the bump, there is also provided an effect of avoiding stress concentration on the periphery of the Al electrode and giving no bonding damage to the chip to improve the assembling yield. What is worried most is that variations of the height of the substrate or variations of the height of the bump cannot be accommodated since the Au bump is less deformable, resulting in not-bonded terminals. However, since the hardness of the Au bump is lowered by heat treatment and the connection terminal is so designed to decrease the size thereof to facilitate the bite of the connection terminal into the Au plating bump, variations of the height due to the local deformation of the Au bump can be accommodated to avoid the problem.

Figure 8:
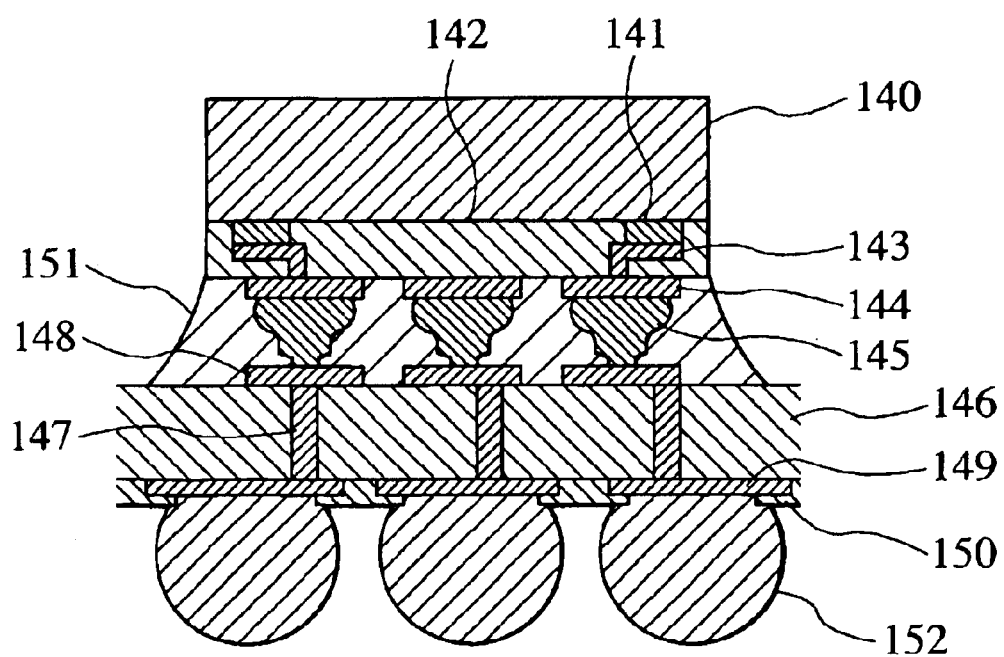
FIG. 8 shows a cross sectional structure of a semiconductor device according to one embodiment of this invention.
Figure 9A:
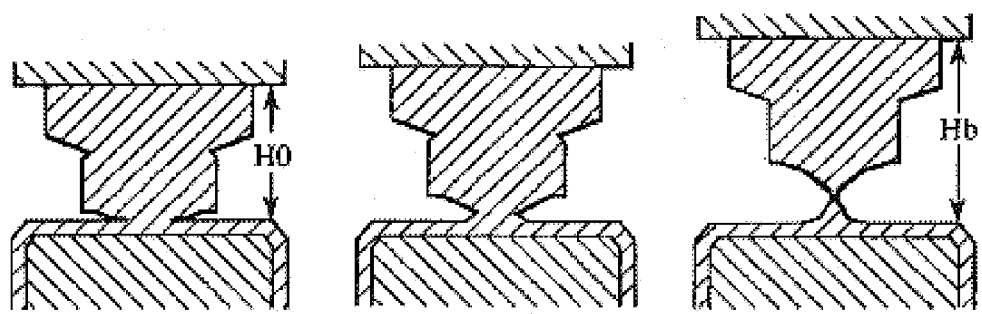
FIG. 9A shows the definition of the elongation of Au upon tensile fracture of the bonded portion.
Figure 9B:
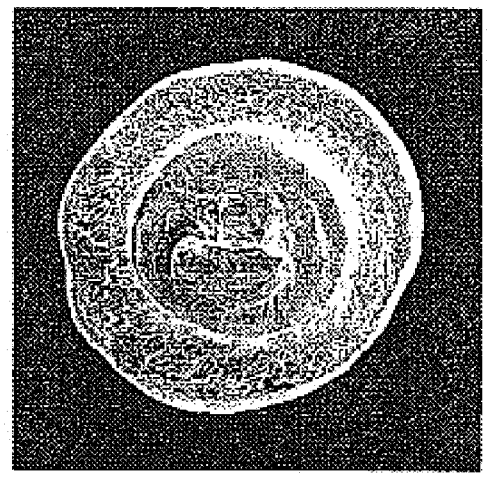
FIGS. 9B and 9C show the examples of fracture.
Figure 9C:
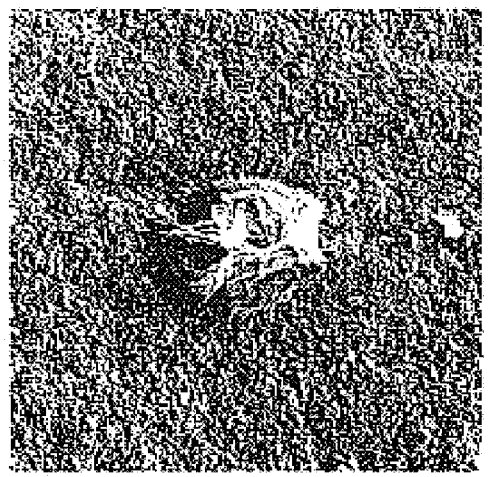
Figure 10A:
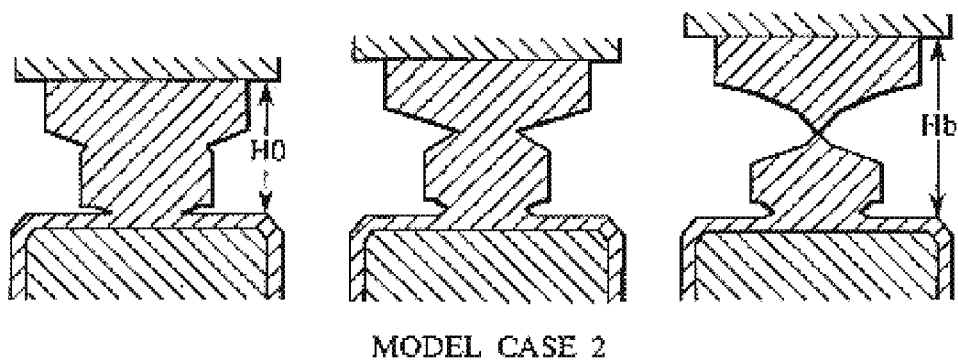
FIG. 10A shows the definition of the elongation of Au upon tensile fracture of the bonded portion.
Figure 10B:
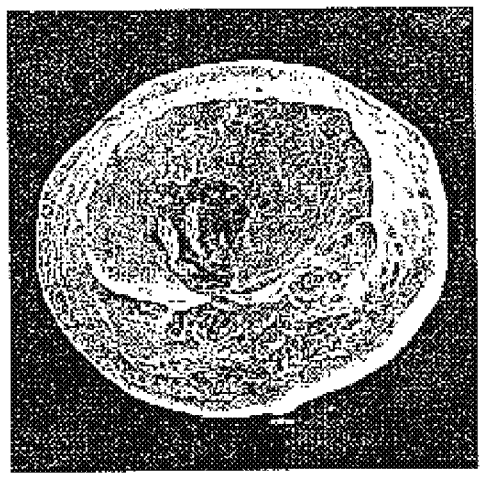
FIGS. 10B and 10C show the examples of fracture.
Figure 10C:
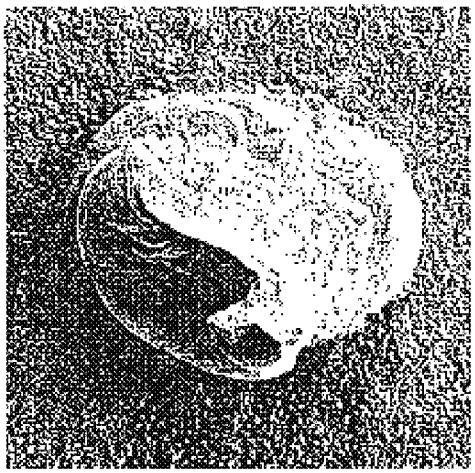
Figure 11A:
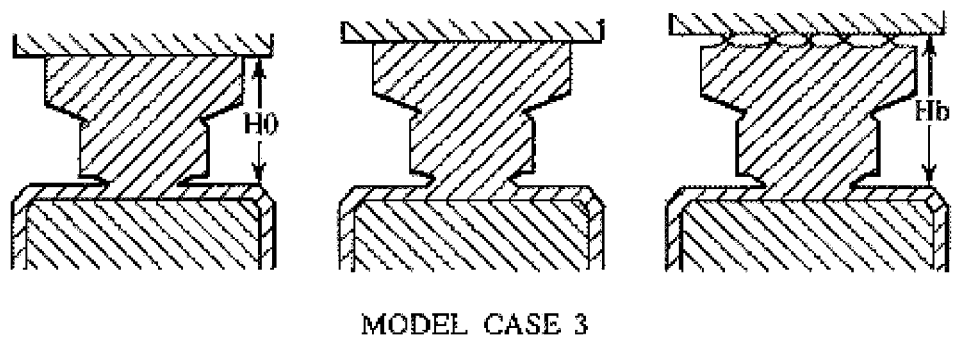
FIG. 11A shows the definition of the elongation of Au upon tensile fracture of the bonded portion.
Figure 11B:
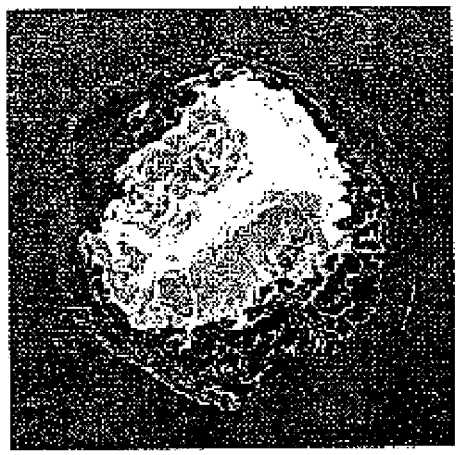
FIGS. 11B and 11C show the examples of fracture.
Figure 11C:
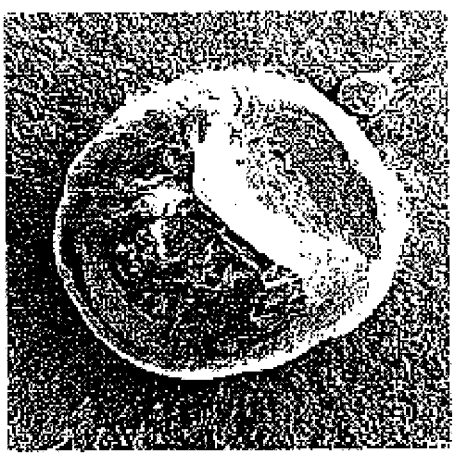
Figure 12:
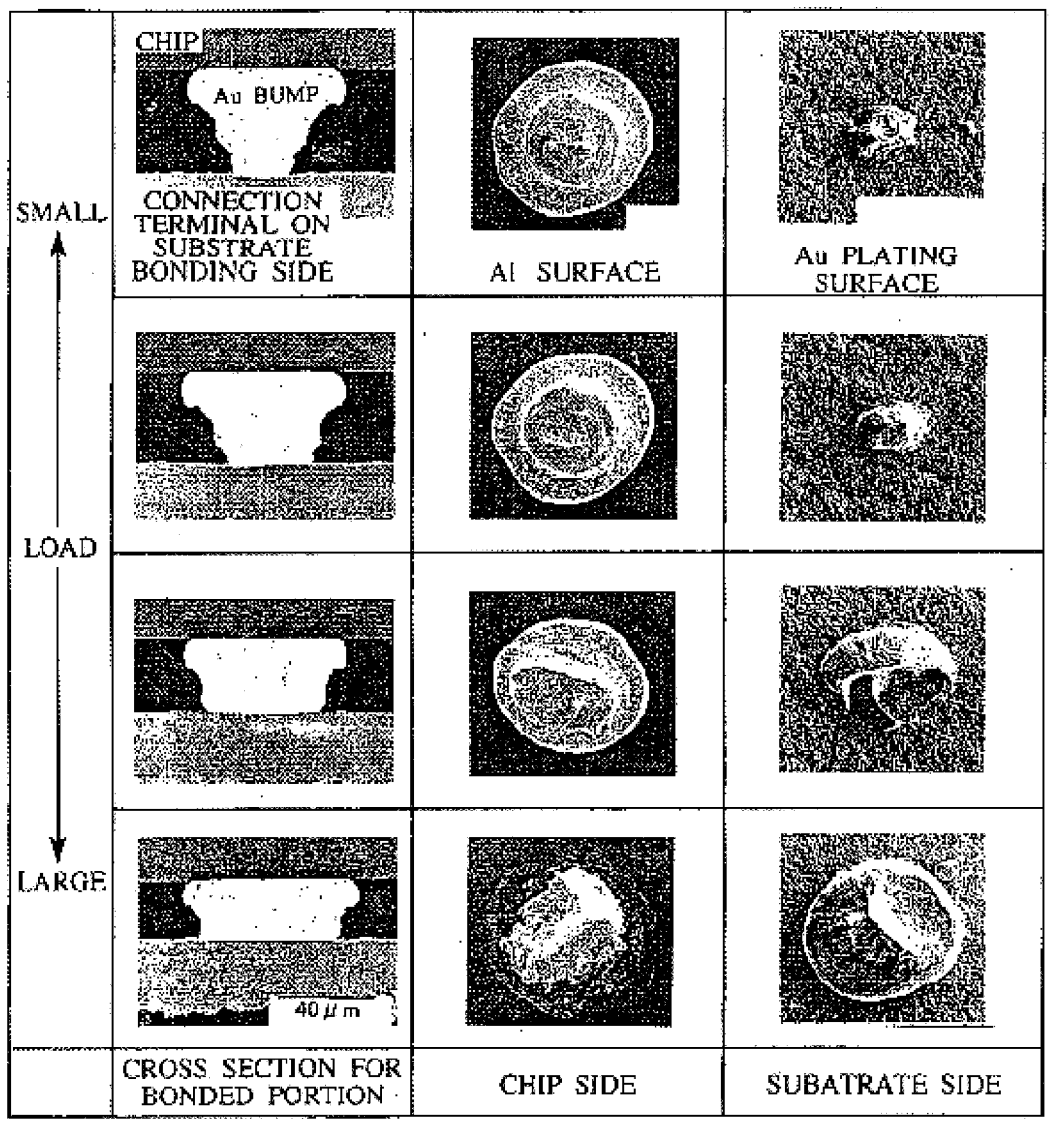
FIG. 12 shows cross sectional shapes and the states of fracture of an Au bump bonded portion.

FIG. 8 shows a cross sectional structure of a semiconductor device according to another embodiment of this invention. In the figure, a re-wiring layer comprising a polyimide insulation film of 2 to 4 $\mu$m in thickness and Cu wiring 143 with a barrier film is formed on a circuit-forming surface of an LSI chip 140, on which electrode terminals 144, the Au films of which are formed at the uppermost surfaces, are formed. A stud bump 145 is formed by a ball bonding method on each of the electrode terminals. The organic wiring substrate is a printed substrate having a wiring pitch of 200 $\mu$m, and connection terminals are applied with electrical Ni/Au plating. Solder bumps are formed on external connection terminals on the opposite side of the substrate. Further, a resin is filled and secured between the chip and the substrate.

According to this embodiment, since a chip in which an enlarging layer by re-wiring is formed in the LSI chip of a fine pitch is used to connect the LSI chip to the organic substrate by Au/Au metal bonding, a usual printed circuit board can be used for the organic wiring substrate making it possible to reduce cost. Further, since this has a structure of transferring stresses upon bonding to the chip by way of the cushioning polyimide, chip damage in the assembling step are eliminated at all and the yield can be improved remarkably being combined with the easy positional alignment. Further, since the heat resistance and the reliability of the connection portion between the chip and the substrate are high, there is no substantial restriction on the mounting process of the module to the mother board, thereby also providing an effect of easy handling and convenience of use.

As has been described above specifically, this invention can provide a method of manufacturing a semiconductor device, in which an LSI chip having electrode pads with a minimum electrode pitch of 100 $\mu$m or less and having 50 or more pins is flip-chip bonded reliably for all the pins by Au/Au metal bonding onto an organic wiring board having a fine wiring layer with a minimum wiring pitch of 100 $\mu$m or less and having a surface insulation layer with low glass transition temperature, without causing positional displacement between the substrate and the chip and without causing chip damage.

Further, this invention can provide a mounting structure and a mounting process having high assembling yields, excellent in productivity, which are able to mount an LSI chip having multiple pins at a fine pitch on an organic wiring substrate having high reliability and low impedance characteristics and having fine wiring layer.

Further, this invention can provide a semiconductor device in which a multi-pin LSI chip having electrode pads of 50 or more pins is mounted by flip chip connection on an organic wiring substrate having a build-up layer comprising a fine wiring layer and an organic insulation layer having low glass transition temperature on a surface layer, and in which the flip-chip connection portion is excellent in heat resistance, electric characteristics, and high temperature and high humidity and temperature recycling reliability.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising;
    a multi-layered wiring substrate at least partially made of an organic material;
    a semiconductor chip formed with an electronic circuit; and
    an organic resin for filling a portion between the semiconductor chip and the multi-layered wiring substrate;
    wherein at least a portion of a constituent member on the multi-layered wiring substrate below a chip connection terminal comprises an organic material having a glass transition temperature of 150° C. or lower, a minimum pitch of the chip connection terminals is 100 $\mu$m or less, a surface metal for the chip connection terminal comprises an Ni-P/Au or Ni-P/Pd/Au plating layer, the total thickness of a noble metal portion of Au or Pd/Au is 0.005 to 0.3 $\mu$m, an Au bump is formed on an electrode terminal of the semiconductor chip, and the Au connection terminal on the substrate is connected to the Au bump of the semiconductor chip by metal bonding.

2. A semiconductor device as defined in claim 1, wherein the multi-layered wiring substrate comprises:
    a core substrate formed of a printed wiring substrate having one-side or both-side wiring pattern; and
    one or more build-up layers each including:
        an organic insulation layer formed by coating and curing a liquid resin or appending a film-like resin on the core substrate;
        a fine wiring layer having Cu wiring with a minimum wiring pitch of 100 $\mu$m or less formed on the organic insulation layer finer than the core substrate; and
        a via hole connection portion for connecting fine upper layer wiring and lower layer wiring.

3. A semiconductor device as defined in claim 1 or 2, wherein the Au bump and the Au connection terminal are flip-chip connected to each other by Au metal bonding showing ductile fracture, a resin containing an inorganic insulative filler is filled between the chip and the substrate, and an external connection terminal of the substrate is formed of a soldering bump.

4. A semiconductor device as defined in claim 2, wherein the organic insulation layer on the core substrate comprises an organic resin with a glass transition temperature Tg of 150° C. or lower and at least a portion of the fine wiring Cu pattern is formed by plating.

5. A semiconductor device as defined in claim 2, wherein the organic insulation layer and the fine wiring layer on the core substrate are formed by adhering a polyimide tape substrate thereto.

6. A semiconductor device comprising:
    a multi-layered wiring substrate at least partially made of an organic material;
    a semiconductor chip formed with an electronic circuit; and
    an organic resin for filling a portion between the semiconductor chip and the multi-layered wiring substrate;
    wherein an Au connection terminal on the multi-wiring substrate is metal bonded to an Au bump on the semiconductor chip, and the crystal structure of the Au bump is coarser on the side of the semiconductor chip and flat and fine, being aligned in the direction of the terminal surface, on the side of the substrate.

7. A semiconductor device has a structure comprising:
    a build-up substrate in which 1 to 4 build-up layers each including an organic insulation layer, Cu plating wiring and a via hole are formed on both surfaces of an organic wiring substrate having a through hole and a both-side wiring pattern, and electroless Ni/Au or electroless Ni/Pd/Au plating with an Au thickness of 0.005 to 0.3 $\mu$m is applied to a terminal surface to be connected with a semiconductor chip; and a semiconductor chip formed with Au bumps on connection electrodes of a bear chip or connection electrodes on a re-wiring layer disposed on a chip surface;
    wherein the Au bump is flip-chip connected to the Au plating surface by Au—Au metal bonding, a gap between the substrate and the chip is filled with a resin containing an inorganic insulation filler, and solder bumps are formed by reflow on external connection terminals on the rear face of the build-up substrate.

8. A semiconductor device comprising:

a multi-layered wiring substrate at least partially made of an organic material;

a semiconductor chip formed with an electronic circuit; and an organic resin for filling a portion between the semiconductor chip and the multi-layered wiring substrate;

wherein the uppermost metal of chip connection terminals on the multi-layered wiring substrate is formed of an Au plating layer, a noble metal stud bump is formed on the surface of an electrode terminal of the semiconductor chip, the Au plating layer on the chip connection terminal is connected to the noble metal bump by metal bonding, and a ratio Sk/Sc of a close contact area Sc between the chip electrode and the bump to a close contact area Sk between the bump and the substrate side connection terminal is ½ or less.

9. A semiconductor device in which a semiconductor chip is mounted on a wiring substrate by flip-chip connection by solid phase metal bonding between noble metals to each other, wherein a metal surface of a semiconductor chip connection terminal on the wiring substrate comprises an Ni/Au or Ni/Pd/Au plating layer, the total thickness of the noble metal portion of Au or Pd/Au is 0.005 to 0.3 $\mu$m, the semiconductor chip comprises an electronic circuit forming area and an electrode pad area on an Si substrate, a re-wiring layer is formed on the surface while interposing an organic insulation layer with a thickness of 2 $\mu$m or more, a connection pad of the re-wiring layer connected electrically with the electrode pad comprises a multi-layered metal structure of Cu/barrier metal/Au with the total thickness of 2 $\mu$m or more, an Au bump is formed on the connection pad, the Au bump and the Au plating surface are flip-chip connected to each other by Au/Au metal bonding, a gap between the substrate and the semiconductor chip is filled with a resin containing an inorganic filler, and a solder bump is formed by reflow on an external connection terminal on the rear face of the wiring substrate.

10. A semiconductor device in which a semiconductor chip is mounted on a wiring substrate by flip-chip connection by solid phase metal bonding between noble metals to each other, wherein a metal surface of a semiconductor chip connection terminal on the wiring substrate comprises an Ni/Au or Ni/Pd/Au plating layer, the total thickness of a noble metal portion of Au or Pd/Au is 0.005 to 0.3 $\mu$m, the semiconductor chip comprises an electronic circuit area having Cu wiring on a Si substrate and a Cu electrode pad area on the Si substrate, Au or Al metallizing treatment is applied by way of a barrier layer to the outermost surface of the Cu electrode pad area, an Au stud bump or a plating bump is formed further thereon, the Au bump is flip-chip connected to the Au plating surface by Au—Au metal bonding, a gap between the substrate and the semiconductor chip is filled with a resin containing an inorganic insulation filler, and a solder bump is formed on an external connection terminal on the rear face of the wiring substrate.

* * * * *